United States Patent
Huang et al.

(10) Patent No.: US 6,943,120 B1
(45) Date of Patent: Sep. 13, 2005

(54) METHOD TO IMPROVE VIA OR CONTACT HOLE PROFILE USING AN IN-SITU POLYMER DEPOSITION AND STRIP PROCEDURE

(75) Inventors: Chuan-Chieh Huang, Hsin-Chu (TW); Feng-Yueh Chang, Banchiau (TW); Chi-Lien Lin, Chia-Yi (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 221 days.

(21) Appl. No.: 10/055,095

(22) Filed: Jan. 23, 2002

(51) Int. Cl.$^7$ ............................................. H01L 21/302
(52) U.S. Cl. ..................................... 438/713; 438/734
(58) Field of Search ................................ 438/706, 707, 438/710, 713, 714, 723, 734–740

(56) References Cited

U.S. PATENT DOCUMENTS

| | | | |
|---|---|---|---|
| 5,851,302 A | 12/1998 | Solis | 134/1.2 |
| 5,925,577 A | 7/1999 | Solis | 438/725 |
| 5,928,967 A | 7/1999 | Radens et al. | 438/740 |
| 6,130,166 A | 10/2000 | Yeh | 438/710 |
| 6,130,169 A | 10/2000 | Shields et al. | 438/725 |
| 6,228,775 B1 | 5/2001 | Coburn et al. | 438/714 |
| 6,232,237 B1 | 5/2001 | Tamaoka et al. | 438/725 |

*Primary Examiner*—Evan Pert

(57) ABSTRACT

A method of forming a narrow diameter opening in an insulator layer, featuring a vertical shape profile, has been developed. Using a photoresist shape as an etch mask a first plasma procedure is used to form an initial opening, with a tapered profile shape, in the insulator layer exposing a portion of the top surface of an underlying stop layer. The first plasma procedure results in formation of a thin polymer layer located at the bottom of the initial opening. A second plasma procedure performed in situ, results in deposition of additional polymer layer, comprised of carbon and fluorine, at the bottom of the initial opening. This is followed by a third plasma procedure, performed in situ in an oxygen plasma, removing polymer and releasing fluorine based radicals which etch portions of insulator layer exposed at the bottom of the initial opening, resulting in a final opening featuring a vertical profile shape.

26 Claims, 3 Drawing Sheets

METHOD TO IMPROVE VIA OR CONTACT HOLE PROFILE USING AN IN-SITU POLYMER DEPOSITION AND STRIP PROCEDURE

BACKGROUND OF THE INVENTION (1) Field of the Invention

The present invention relates to methods used to fabricate semiconductor devices, and more specifically to a method used to improve the profile of a contact or via hole defined in an insulator layer.

(2) Description of Prior Art

Micro-miniaturization, or the ability to fabricate semiconductor devices with sub-micron features, has allowed the performance of semiconductor devices to be increased while the processing costs for semiconductor chips comprised with devices formed with these same sub-micron features have been reduced. Smaller device features have resulted in a reduction of performance degrading, parasitic junction capacitances. In addition the use of sub-micron features allow a larger number of smaller semiconductor chips to be obtained from a specific size starting semiconductor substrate thus reducing the processing costs for a specific semiconductor chip. The smaller semiconductor chips comprised with sub-micron features still supply device densities equal to, or greater than, counterpart semiconductor chips comprised with larger device features.

The use of sub-micron features can however present difficulties in specific areas of the semiconductor device fabrication procedure. For example the definition of contact holes used to expose an active device region, or the definition of a via hole used to expose an underlying metal structure, can be difficult to achieve for sub-micron diameter openings, (contact/via holes). The desired narrow diameter opening demands a near vertical profile to allow a maximum of underlying contact area to be exposed, in contrast to a contact hole with a tapered profile in which area of the exposed underlying conductive region has been reduced as a result of the unwanted tapered profile. The reduction in exposed area will deleteriously influence the contact or interface resistance generated at the interface of a metal structure in the contact/via opening and the underlying conductive region. In addition, to terminate the contact/via opening dry etch procedure, an etch chemistry selectively terminating at the underlying conductive region has to be employed, usually resulting in formation of polymer layer, which in turn deleteriously influences the ability to define a sub-micron diameter, vertical profile, for the contact/via opening.

This invention will describe a procedure in which a novel, in situ polymer deposition, and polymer removal cycle, is performed after definition of the contact/via opening in an insulator layer, with this novel, in situ deposition and removal procedure, modifying a tapered profile shape to a more vertical profile shape. Prior art such as Sorlis in U.S. Pat. No. 5,851,302, as well as Yeh in U.S. Pat. No. 6,130,166, describe methods of removing polymer and photoresist after definition of specific openings, however these prior arts do not describe the novel procedure described in the present invention in which a tapered profile shape of a contact/via opening is modified to a more vertical profile, via a post-definition, intentional deposition of additional polymer followed by an in situ removal step.

SUMMARY OF THE INVENTION

It is an object of this invention to define a narrow diameter contact, or via opening, in an insulator layer, to expose a portion of the top surface of an underlying active device region, or of an underlying metal structure.

It is another object of this invention, after definition of the narrow diameter contact/via opening, comprised with an initial profile shape, perform a polymer deposition and removal procedure, to modify the initial profile shape to a final, and more vertical profile shape.

It is still another object of this invention to remove the additional polymer formed in the polymer deposition step, in situ, in the same chamber used to deposit the additional polymer material.

In accordance with the present invention a method of forming a narrow diameter contact/via opening in an insulator layer, wherein an initial, tapered profile shape is modified to a more vertical profile shape via a post-definition, polymer deposition and removal procedure, is described. A photoresist shape is used as an etch mask to allow a dry etch procedure to define a narrow diameter opening in an insulator layer, with the dry etch procedure terminating on an underlying, conductive stop layer, which in turn overlays a conductive region such as an active device region, or a metal structure. The dry etch procedure results in formation of polymer material located primarily at the bottom of the contact/via opening, with the defined contact/via opening exhibiting a tapered profile, featuring a smaller diameter opening at the bottom of the contact/via opening when compared to a larger diameter opening located at the top of the opening. With the photoresist shape still in place additional polymer is intentionally deposited, primarily at the bottom of the contact/via opening, followed by in situ removal of all polymer material. The in situ removal of polymer material results in the release of fluorine based radicals from the volatilizing polymer layer, with the fluorine based radicals etching exposed insulator layer surfaces located at, or near the bottom of the tapered contact/via opening, and resulting in a more vertical profile shape for the contact/via opening.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
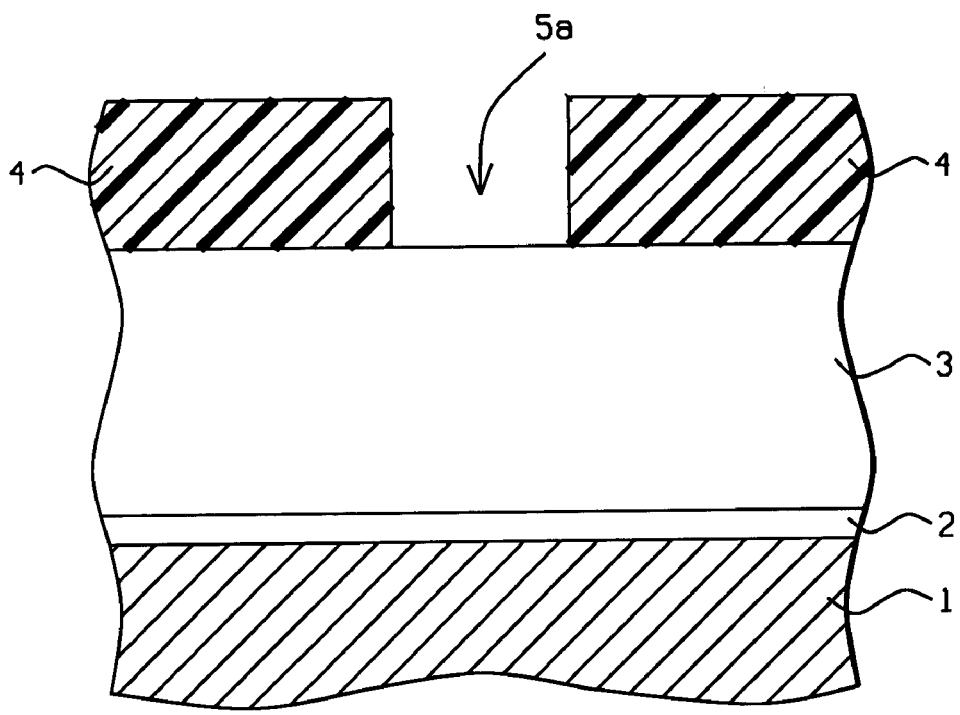
FIGS. 1–5, which schematically, in cross-sectional style, show key process stages used to define a narrow diameter contact/via opening in an insulator layer, featuring an initial tapered profile shape, modified to a more vertical, final profile shape via an in situ polymer deposition and removal procedure.

The method of forming a narrow diameter contact/via opening, in an insulator layer, wherein an initial, tapered profile shape is modified to a more vertical profile shape via a post-definition, polymer deposition and removal procedure, will now be described in detail. Conductive region 1, such as a metal interconnect structure, or an active device region in a semiconductor substrate, for example a heavily doped source/drain region, is provided and schematically shown in FIG. 1. A stop layer, or a material that will exhibit a low etch rate in a etch chemistry used to open a contact or via hole in an insulator layer, is next formed on conductive region 1. Stop layer 2, can be a conductive layer, such as a titanium nitride or titanium disilicide, obtained via plasma vapor deposition procedures at a thickness between about 150 to 400 Angstroms. Stop layer 2, will only be partially removed during the subsequent contact/via opening procedure, therefore remaining to underlay a metal structure to be subsequently formed in the contact/via opening. Therefore for purposes of contact or interface resistance it is imperative that a conductive stop layer be used. Insulator layer 3, such as a silicon oxide layer, or a boro-phosphosilicate (BPSG), layer, is next deposited via low pressure chemical vapor deposition (LPCVD), or plasma enhanced chemical vapor deposition (PECVD), procedures, to a thickness between about 4000 to 15000 Angstroms. A chemical mechanical polishing (CMP), procedure, if desired, can be used for planarization purposes allowing a smooth top surface topography for insulator layer 3, to be achieved. Photoresist shape 4, with opening 5a, is next formed on the smooth top surface topography of insulator layer 3. The diameter of opening 5a, in photoresist shape 4, is between about 0.20 to 0.25 um. The result of these procedures is schematically shown in FIG. 1.

Figure 2:
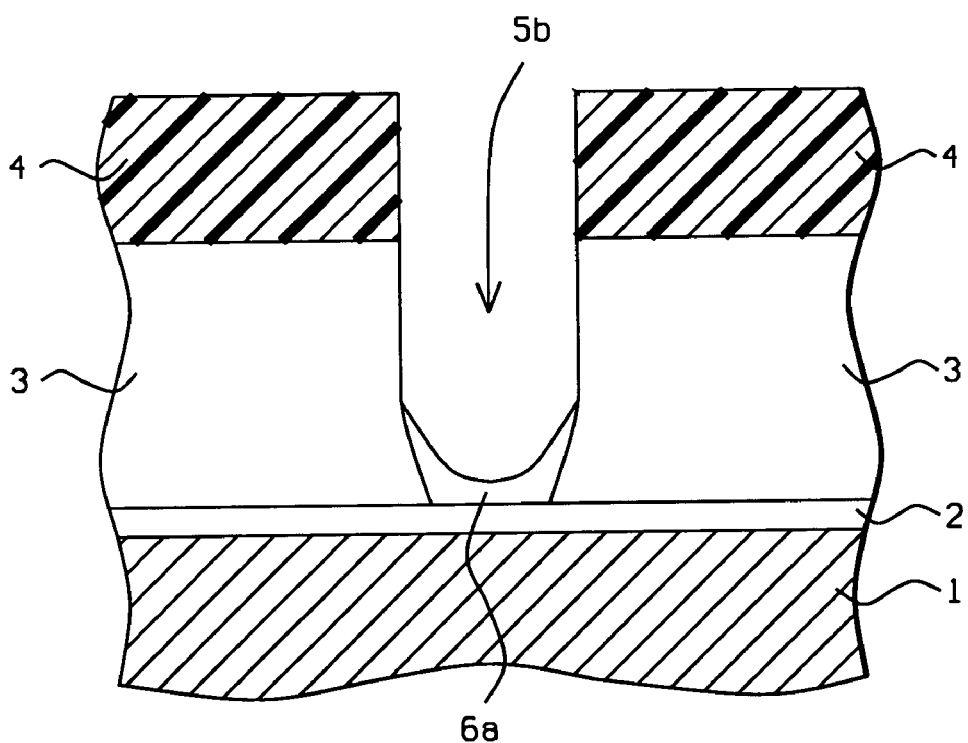

A dry etch procedure, or a reactive ion etch (RIE), procedure is next used to define contact/via opening 5b, in insulator layer 3, with the RIE procedure selectively terminating at the top surface of stop layer 2. To obtain a high etch rate ratio of insulator layer 3, to stop layer 2, between about 5 to 1, to 20 to 1, a $CHF_3$ etchant is used, with RIE conditions featuring an RF power between about 500 to 1000 watts, and a pressure between about 30 to 200 mtorr. At the first appearance of stop layer 2, or near the end point of the $CHF_3$ RIE procedure, polymer layer 6a, at a thickness between about 0 to 500 Angstroms is formed at the bottom of contact/via opening 5b, on the top surface of stop layer 2, in addition to forming on the sides of insulator layer 3, near the bottom of contact/via opening 5b. The formation of polymer layer 6a, comprised of carbon and fluorine, can interfere with the final definition of contact/via opening 5b, not allowing a desired vertical profile to be continued, and resulting in a tapered profile for contact/via opening 5b. The result of the RIE definition procedure is schematically shown in FIG. 2. The consequence of a tapered profile for narrow diameter contact/via opening 5b, is reduced contact area for a subsequent overlying metal structure filling narrow diameter contact/via opening 5b, thus presenting unwanted increases in contact or interface resistance. The diameter at the bottom of contact/via opening 5b, due to the unwanted tapered profile, has been reduced to between about 0.15 to 0.18 um, while the diameter of contact/via opening 5b, at the top of the opening remains between about 0.20 to 0.25 um.

A first embodiment of this invention is to in situ remove polymer layer 6a, in the same chamber used to define contact/via opening 5b. The in situ removal procedure is performed at a pressure between about 500 to 1000 watts, at a pressure between about 30 to 200 mtorr, in an oxygen/argon ambient. This procedure also results in removal of photoresist shape 4. The limited thickness of polymer layer 6a, between about 0 to 500 Angstroms, only resulted in limited levels of fluorine radicals being released from thin polymer layer, therefore resulting in only slight improvements, or modifications of the tapered profile of contact/via opening 5b.

Figure 3:
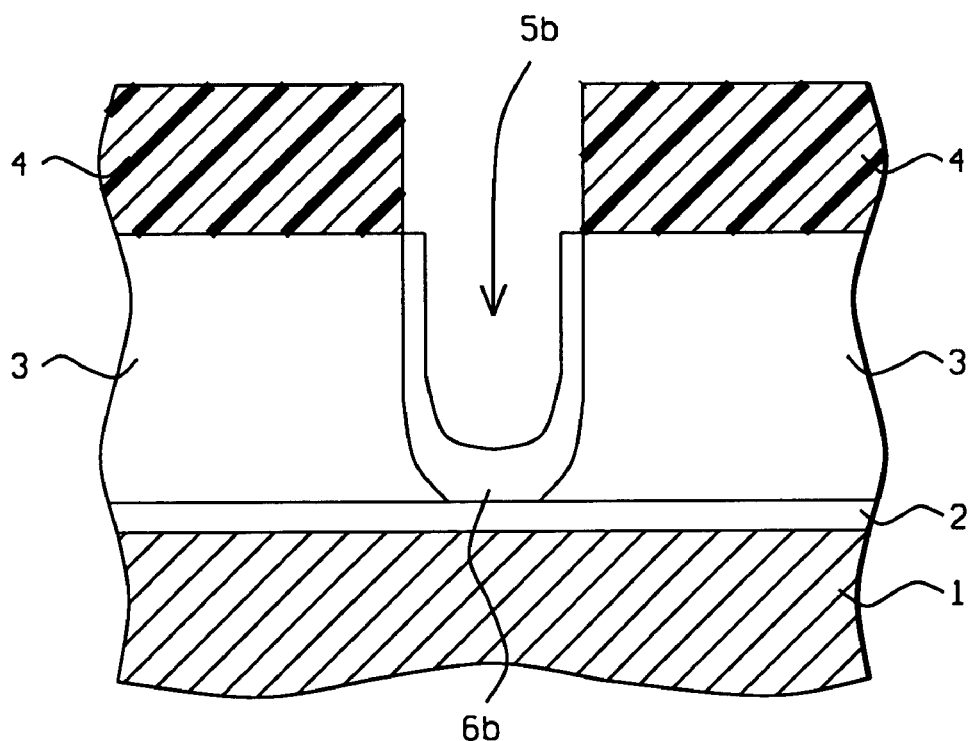
Figure 4:
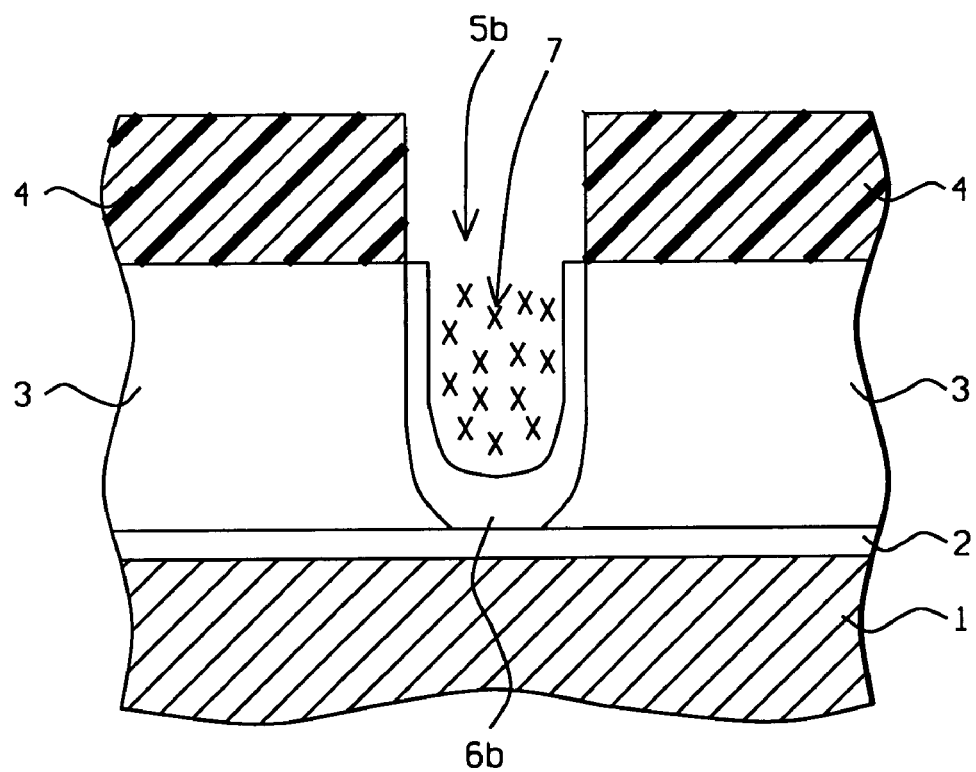
Figure 5:
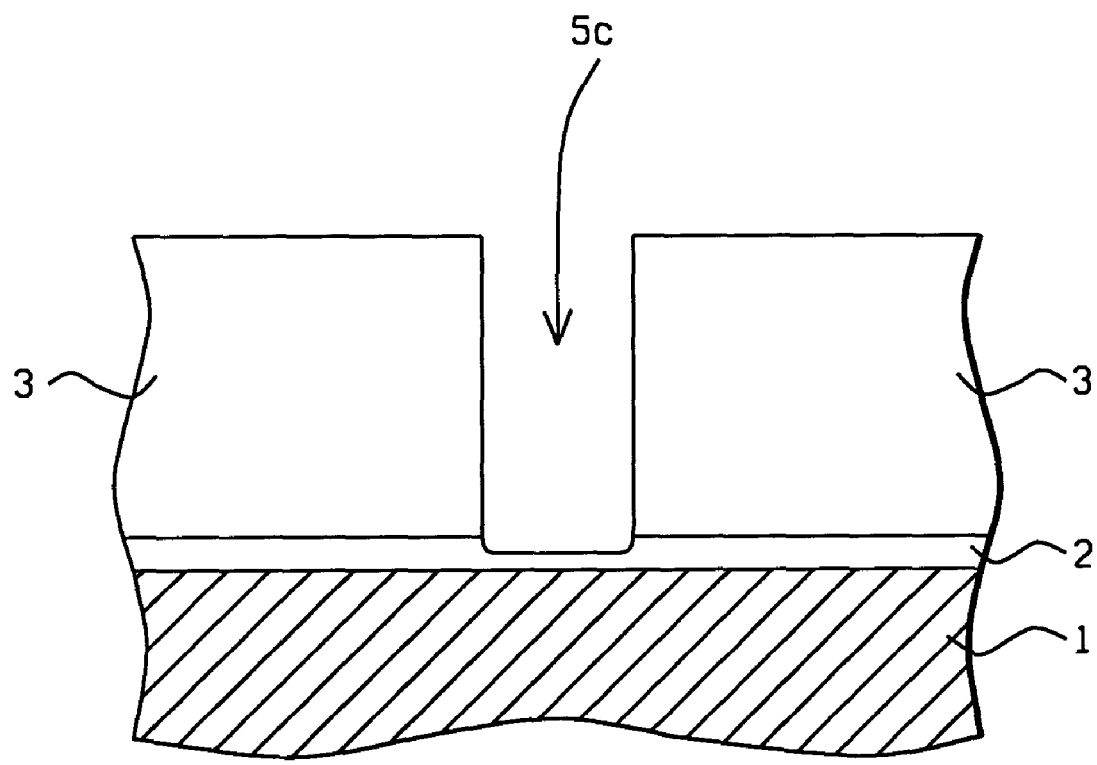

Additional methods of more aggressively modifying the tapered profile of contact/via opening 5b, is next described and schematically illustrated using FIGS. 3–5. A second embodiment of this invention is a procedure to deposit additional polymer, increasing the thickness of polymer layer 6a, located at the bottom of contact/via opening 5b, and resulting in thick polymer layer 6b, with the bulk of polymer layer 6b, again located at the bottom of contact/via opening 5b, and with a thinner portion of polymer layer 6b, formed on the sides of insulator layer 3, exposed in contact/via opening 5b, is next addressed. With photoresist shape 4, in place, deposition of additional polymer layer is accomplished via a plasma procedure performed in situ, in the same chamber used to define contact/via opening 5b, via use of a chamber chemistry containing polymer constituents carbon and fluorine. Thick polymer layer is therefore formed in an ambient using either $CH_2F_2$, $C_4F_8$, $C_4F_8/CO$, $C_5F_8$, or other carbon-fluorine type gases, at an RF power between about 500 to 1000 watts, and at a pressure between about 30 to 200 mtorr. The thickness of polymer layer 6b, at the bottom of contact/via opening 5b, is between about 50 to 500 Angstroms. The result of the in situ polymer procedure is schematically shown in FIG. 3.

The in situ deposition of polymer layer 6b, is followed by an in situ removal of polymer layer 6b, again performed in the same chamber used for definition of contact/via opening 5b, and deposition of thick polymer layer 6b. The polymer removal procedure is another plasma procedure performed at an RF power between about 500 to 1000 watts, at a pressure between about 30 to 200 mtorr, using an oxygen/argon ambient. The use of the oxygen/argon ambient results in volatilization and dissociation of thick polymer layer 6b, releasing fluorine based radicals 7, from the carbon-fluorine containing, thick polymer layer. A larger concentration of fluorine based radicals 7, is created at the bottom of contact/via opening 5b, than at the top, as a result of the thicker polymer layer residing at the bottom of the opening. This is schematically shown in FIG. 4. While the oxygen component of the ambient results in removal or ashing of photoresist shape 4, as well as of thick polymer layer 6b, the fluorine based radicals attack the now exposed sides of insulator layer 3, specifically at the bottom of contact/via opening 5b, where their concentration was highest, resulting in modification of the tapered profile shape of contact/via opening 5b. The effect of the fluorine based radicals, released during the in situ removal of a thick, in situ deposited polymer layer, is the modification of the tapered profile shape of contact/via opening 5b, achieving contact/via opening 5c, now exhibiting a vertical profile shape, with the diameter at the bottom of the opening equal to the diameter at the top of the opening, between about 0.20 to 0.25 um. In addition to modifying the profile shape of the contact/via opening, the fluorine based radicals also remove a top portion of stop layer 2, exposed in contact/via opening 5c. The result of these procedures is schematically shown in FIG. 5.

A third embodiment of this invention is to remove polymer layer 6a, formed during definition of contact/via opening 6a, also removing photoresist shape 4. This is followed by deposition of a thick polymer layer, performed in situ in the same chamber used to remove polymer layer 6a, and using conditions identical to the conditions used to deposit thick polymer in the second embodiment of this invention. In situ removal of the thicker, deposited polymer layer, again via conditions previously described in the second embodiment, again results in release of fluorine based radicals modifying the tapered profile in a similar manner described in the second embodiment.

While this invention has been particularly shown and described with reference to the preferred embodiments thereof, it will be understood by those skilled in the art that various changes in form and details may be made without departing from the spirit or scope of the invention.

What is claimed is:

1. A method of forming a contact or via (contact/via) opening, in an insulator layer, comprising the steps of:
   providing a conductive region;
   forming a conductive stop layer on said conductive region;
   depositing an insulator layer;
   forming an initial contact/via opening in said insulator layer, exposing a portion of said conductive stop layer;
   forming a fluorine based polymer layer at the bottom of said initial contact/via opening and upon said conductive stop layer; and
   performing a procedure to in situ remove said fluorine based polymer layer, with fluorine based radical released from said fluorine based polymer layer during in situ removal procedure, resulting in etching of portions of said insulator layer exposed at bottom of said initial contact/via opening, creating a final contact/via opening.

2. The method of claim 1, wherein said conductive region is an active device region in a semiconductor substrate, such as a heavily doped source/drain region, or said conductive region is a metal structure.

3. The method of claim 1, wherein said conductive stop layer is a titanium nitride layer, obtained via plasma vapor deposition procedures at a thickness between about 150 to 400 Angstroms.

4. The method of claim 1, wherein said insulator layer is a silicon oxide or a boro-phosphosilicate (BPSG), layer, obtained via LPCVD or PECVD procedures at a thickness between about 4000 to 15000 Angstroms.

5. The method of claim 1, wherein said initial contact/via opening is formed in said insulator layer via an reactive ion etching procedure, performed at a power between about 500 to 1000 watts, and at a pressure between about 30 to 200 mtorr, using $CHF_3$ as an etchant.

6. The method of claim 1, wherein the etch rate ratio of said insulator layer to said conductive stop layer, in a $CHF_3$ ambient, is between about 5 to 1, to 20 to 1.

7. The method of claim 1, wherein said initial contact/via opening is comprised with a tapered profile shape, featuring a diameter at the top surface of said insulator layer between about 0.20 to 0.25 um, while the diameter located at the bottom of the opening is between about 0.15 to 0.18 um.

8. The method of claim 1, wherein said fluorine based polymer layer is obtained via a plasma deposition procedure, performed in situ in the same chamber used to define said initial contact/via opening, at a power between about 500 to 1000 watts, and at a pressure between about 30 to 200 mtorr, using a gas chosen from a group containing $CH_2F_2$, $C_4F_4$, $C_4F_8/CO$, and $C_5F_8$.

9. The method of claim 1, wherein said fluorine based polymer layer is formed to a thickness up to 500 Angstroms.

10. The method of claim 1, wherein an removal procedure for said fluorine base polymer layer is a plasma procedure, performed in situ in said chamber used for definition of said initial contact/via opening and for deposition of said fluorine based polymer layer, at a power between about 500 to 1000 watts, and at a pressure between about 30 to 200 mtorr, using an oxygen/argon ambient.

11. The method of claim 1, wherein said final contact/via opening is comprised with a diameter at the top of the opening between about 0.20 to 0.25 um, and with a diameter at the bottom of the opening between about 0.20 to 0.25 um.

12. A method of forming a contact/via opening in an insulator layer, featuring a plasma polymer deposition and removal procedure used to modify said contact/via opening from a tapered profile shape to a vertical profile shape, comprising the steps of:
   providing a conductive region;
   forming a conductive stop layer on said conductive region;
   depositing a silicon oxide layer;
   performing a chemical mechanical polishing procedure to create a smooth top surface topography for said silicon oxide layer;
   forming a photoresist shape on said silicon oxide layer, with an opening in said photoresist shape exposing a portion of a top surface of said silicon oxide layer;
   performing a reactive ion etching (RIE) procedure to define an initial contact/via opening with a tapered profile shape, in said silicon oxide layer, and forming a thin polymer layer on said conductive stop layer located at bottom of said initial contact/via opening;
   depositing an additional polymer layer via a plasma procedure performed in situ in same chamber used for definition of said contact/via opening, resulting in a thick polymer layer comprised of said thin polymer layer and of said additional polymer layer, with said thick polymer layer, located at the bottom of said initial contact/via opening, comprised of carbon and fluorine; and
   removing said thick polymer layer, and said photoresist shape, via a plasma procedure performed in an oxygen containing ambient, in situ in same chamber used for deposition of additional polymer layer, with polymer removal procedure releasing fluorine based radicals which in turn etch of portions of said silicon oxide layer exposed at bottom of said initial contact/via opening, creating a final contact/via opening via, featuring a vertical profile shape.

13. The method of claim 12, wherein said conductive region is an active device region in a semiconductor substrate, such as a heavily doped source/drain region.

14. The method of claim 12, wherein said conductive region is a metal structure.

15. The method of claim 12, wherein said conductive stop layer is a titanium nitride layer, obtained via plasma vapor deposition procedures at a thickness between about 150 to 400 Angstroms.

16. The method of claim 12, wherein said silicon oxide layer is obtained via LPCVD or PECVD procedures at a thickness between about 4000 to 15000 Angstroms.

17. The method of claim 12, wherein said RIE procedure, used to define said initial contact/via opening in said silicon oxide layer, is performed at a power between about 500 to 1000 watts, and at a pressure between about 30 to 200 mtorr, using $CHF_3$ as an etchant.

18. The method of claim 12, wherein the etch rate ratio of said silicon oxide layer to said conductive stop layer, in a $CHF_3$ ambient, is between about to 1, to 20 to 1.

19. The method of claim 12, wherein said initial contact/via opening, formed with a tapered profile shape, is comprised with a diameter at the top of said initial contact/via opening between about 0.20 to 0.25 um, while the diameter located at the bottom of the opening is between about 0.15 to 0.18 um.

20. The method of claim 12, wherein said additional polymer layer is deposited via a plasma procedure performed in situ, in the same chamber used to define said initial contact/via opening, at a power between about 500 to 1000 watts, and at a pressure between about 30 to 200 mtorr, using a source gas chosen from a group containing $CH_2F_2$, $C_4F_4$, $C_4F_8/CO$, and $C_5F_8$.

21. The method of claim 12, wherein said thick polymer layer, comprised of said thin polymer layer and of said additional polymer layer, is formed to a thickness up to 500 Angstroms.

22. The method of claim 12, wherein removal of said thick polymer layer is performed via a plasma procedure, in situ, in said chamber used for definition of said initial contact/via opening and for said deposition of said additional polymer layer, at a power between about 500 to 1000 watts, and at a pressure between about 30 to 200 mtorr, in an oxygen/argon ambient.

23. The method of claim 12, wherein said final contact/via opening, formed with said vertical shape profile, is comprised with a diameter at the top of the opening between about 0.20 to 0.25 um, and with a diameter at the bottom of the opening between about 0.20 to 0.25 um.

24. A method of modifying an initial contact/via opening in an insulator layer, featuring a tapered profile shape, to a final contact/via opening, featuring a vertical profile shape, comprising the steps of:

forming a photoresist shape on said insulator layer, wherein said insulator overlays a conductive stop layer, with an opening in said photoresist shape exposing a portion of top surface of said insulator layer;

performing a plasma dry etch procedure with a first phase of said dry etch procedure used to form said initial contact/via opening comprised with said tapered profile shape in said insulator layer, and to form a thin polymer layer on said conductive stop layer located at bottom of said initial contact/via opening, then continuing with a second phase of said plasma dry etch procedure to form additional polymer at bottom of said initial contact/via opening; and performing an in situ plasma oxygen procedure to remove said photoresist shape, to remove said thin polymer layer, and to remove said additional polymer layer, from said conductive stop layer located at bottom of said initial contact/via opening, with said in situ plasma oxygen procedure allowing release of fluorine based radicals from polymer layers, and with said fluorine based radicals etching portions of said insulator layer exposed at bottom of said initial contact/via opening, creating said final contact/via opening via, featuring said vertical profile shape.

25. The method of claim 24, wherein said initial contact/via opening, comprised with said tapered profile shape, has a top diameter opening between about 0.20 to 0.25 um, and a bottom diameter opening between about 0.15 to 0.18 um.

26. The method of claim 24, wherein said final contact/via opening, comprised with said vertical profile, has a top diameter opening between about 0.20 to 0.25 um, and a bottom diameter opening between about 0.20 to 0.25 um.

* * * * *